(12) United States Patent
Pickelsimer et al.

(10) Patent No.: US 9,722,021 B2
(45) Date of Patent: Aug. 1, 2017

(54) ISOLATED WELL CONTACT IN SEMICONDUCTOR DEVICES

(71) Applicant: Texas Instruments Incorporated, Dallas, TX (US)

(72) Inventors: Bruce Lynn Pickelsimer, McKinney, TX (US); Patrick Robert Smith, Rockwall, TX (US); Terry James Bordelon, Jr., Flower Mound, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/843,082

(22) Filed: Sep. 2, 2015

(65) Prior Publication Data

US 2017/0062558 A1  Mar. 2, 2017

(51) Int. Cl.
*H01L 21/225*  (2006.01)
*H01L 29/06*  (2006.01)
*H01L 29/788*  (2006.01)
*H01L 29/66*  (2006.01)
*H01L 21/306*  (2006.01)
*H01L 21/283*  (2006.01)

(52) U.S. Cl.
CPC ...... *H01L 29/0649* (2013.01); *H01L 21/2253* (2013.01); *H01L 21/283* (2013.01); *H01L 21/30604* (2013.01); *H01L 29/6656* (2013.01); *H01L 29/788* (2013.01)

(58) Field of Classification Search
None
See application file for complete search history.

(56) References Cited

U.S. PATENT DOCUMENTS

| 2009/0057711 A1* | 3/2009 | Chen | H01L 27/0925 257/141 |
| 2010/0327350 A1* | 12/2010 | Loechelt | H01L 21/76895 257/341 |
| 2013/0161739 A1* | 6/2013 | Tseng | H01L 29/404 257/336 |
| 2015/0084108 A1* | 3/2015 | Saha | H01L 21/82380 257/314 |

* cited by examiner

*Primary Examiner* — Charles Garber
*Assistant Examiner* — Steven Christopher
(74) *Attorney, Agent, or Firm* — Jacqueline J. Garner; Charles A. Brill; Frank D. Cimino

(57) ABSTRACT

An integrated circuit and method has an isolated well with an improved isolated well contact. The well contact diffusion is isolated from a device diffusion of opposite conductivity type within the isolated well by an isolation transistor gate.

17 Claims, 8 Drawing Sheets

ISOLATED WELL CONTACT IN SEMICONDUCTOR DEVICES

FIELD OF THE INVENTION

This invention relates to the field of integrated circuits. More particularly, this invention relates to electrical contact to isolated wells in semiconductor devices.

BACKGROUND

As semiconductor integrated circuits have scaled, both lateral and vertical dimensions have decreased. As the depth of isolated wells has decreased, the cross sectional area of the well under isolation such as shallow trench isolation (STI) has decreased resulting in increased resistance. To compensate retrograde well doping is used, where the doping at the bottom of the well is increased thus reducing the well resistance under the STI.

While retrograde well doping is sufficient for nominal voltages the well resistance under the STI may still be sufficiently high to cause a significant voltage drop when the well is under high bias and significant current is flowing between the well contact and a device such as a transistor formed in the isolated well. This drop in voltage negatively impacts the performance of the device.

A typical integrated circuit with a transistor formed in an isolated well is illustrated in FIG. 1. The transistor 110 is formed in the isolated well 104 in substrate 102. Shallow trench isolation (STI) geometries 108 electrically isolate the well 104 from the substrate 102 by blocking silicide 112 from shorting the well contact diffusion 146 to the substrate contact diffusion 156. STI geometries 106 electrically isolate the well contact diffusions 146 from the transistor source and drain diffusions 154. Contact plugs 116 couple diffusions 156, 154, and 146 in the substrate 102 and well 104 to the first level of interconnect 126.

The cross sectional area 114 of the well 104 under the STI geometry 106 is significantly smaller than the cross sectional area of the well adjacent to the STI geometry. This smaller cross sectional area 114 may cause current crowding when high bias is applied to the well 104 and significant current flows between a device diffusion 154 (such as a transistor) and the well contact diffusion 146. This current crowding may cause a voltage drop which may negatively impact the performance of a device such as a transistor 110.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing an isolated well with an improved isolated well contact is described. The well contact diffusion is isolated from a device diffusion of opposite doping type within the isolated well by an isolation transistor gate. A process for forming an integrated circuit containing an isolated well with an improved isolated well contact is described. A process for simultaneously forming a device transistor within an isolated well and forming an improved isolated well contact is described.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
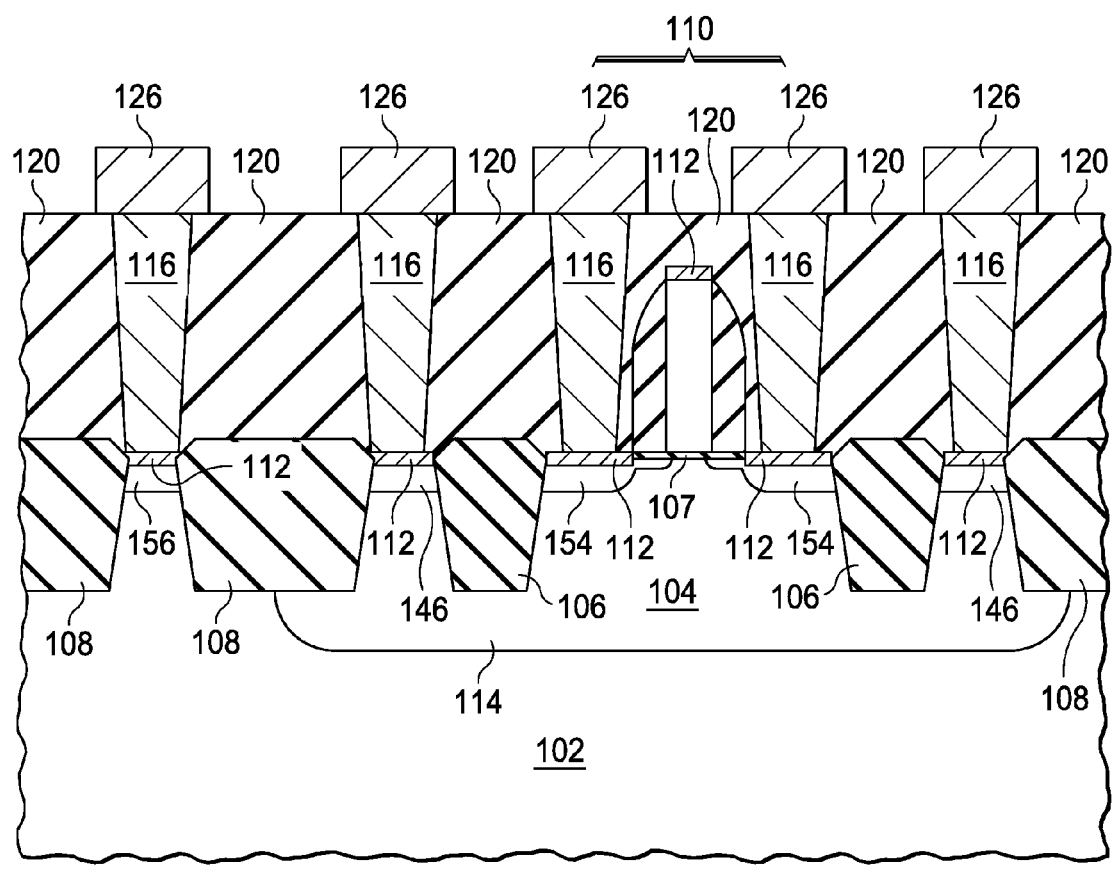
FIG. 1 (Prior art) is a cross-section of an integrated circuit with a well contact isolated from a device diffusion by shallow trench isolation.
Figure 2:
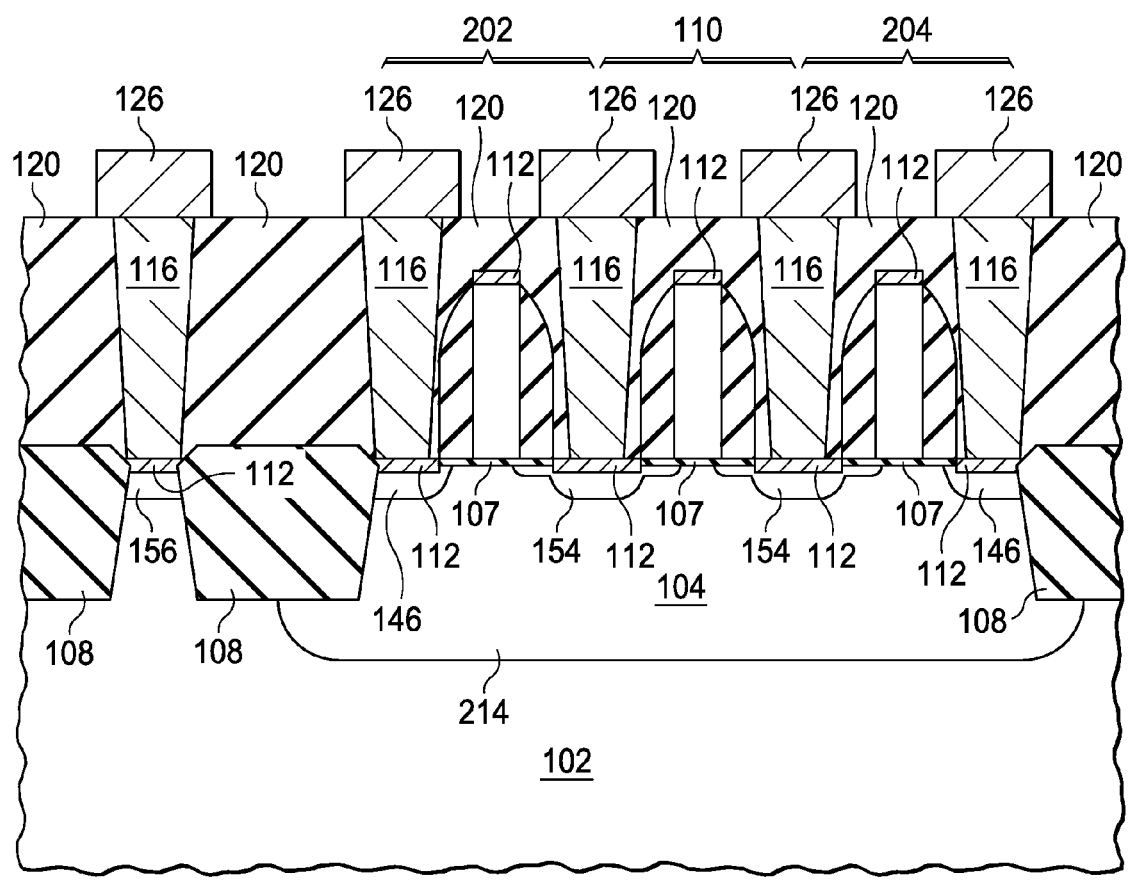
FIG. 2 is a cross-section of an integrated circuit with a well contact isolated from device diffusion by an isolation transistor gate.

An embodiment integrated circuit with an improved isolated well contact that significantly reduces voltage drop when high bias is applied to the isolated well is illustrated in FIG. 2. Similar to FIG. 1, the transistor 110 is formed in an isolated well 104 of a second conductivity type (e.g., n-type) in substrate 102 of a first conductivity type (e.g., p-type). Transistor 110 includes a gate and source and drain regions 154. Shallow trench isolation (STI) geometries 108 electrically isolate the well 104 from the substrate 102 by blocking silicide 112 from shorting the well contact diffusion 146 of the second conductivity type (e.g., n-type) to the substrate contact diffusion 156 of the first conductivity type (e.g., p-type). Contact plugs 116 couple diffusions 156, 154, and 146 in the substrate 102 and well 104 to the first level of interconnect 126.

Instead of STI geometries 106 (FIG. 1) separating the isolated well contact diffusions 146 from the source and drain diffusions 154 of the transistor 110, isolation transistor gates 202 and 204 are employed. The isolation transistor gates, 202 and 204, block silicide 112 from shorting the well contact diffusions 146, to the transistor source and drain diffusions 154. The isolation transistor gates, 202 and 204, may be left electrically floating (unconnected to any other device elements) or may be tied to a fixed voltage node such as a ground terminal or the well 104 potential.

For purposes of illustration, the isolation transistor gates, 202 and 204, isolate the well contact diffusions 146 from the source and drain diffusions, 154, of a MOS transistor. Optionally the isolation transistor gates, 202 and 204, may isolate the well contact diffusions 146 from other types of devices formed in the isolated well 104 such as bipolar transistors, resistors, capacitors, memory cells, etc. Two well contact diffusions 146 are used for illustration but any number of well contact diffusions may be used.

As shown in FIG. 2, the cross sectional area 214 of the isolated well 104 under the isolation transistor gates, 202 and 204 is significantly larger than the cross sectional area 114 (FIG. 1) under the STI isolation. The increased cross sectional area 214 significantly reduces current crowding that causes the voltage drop when high bias is applied to the isolated well 104 and the device 110 draws significant current.

The major steps in an integrated circuit process flow that forms an integrated circuit with the improved isolated well contact is illustrated in the cross sections in FIGS. 3A-3G. This process flow provides an improved isolated well contact with no additional processing steps and no additional cost.

Figure 3A:
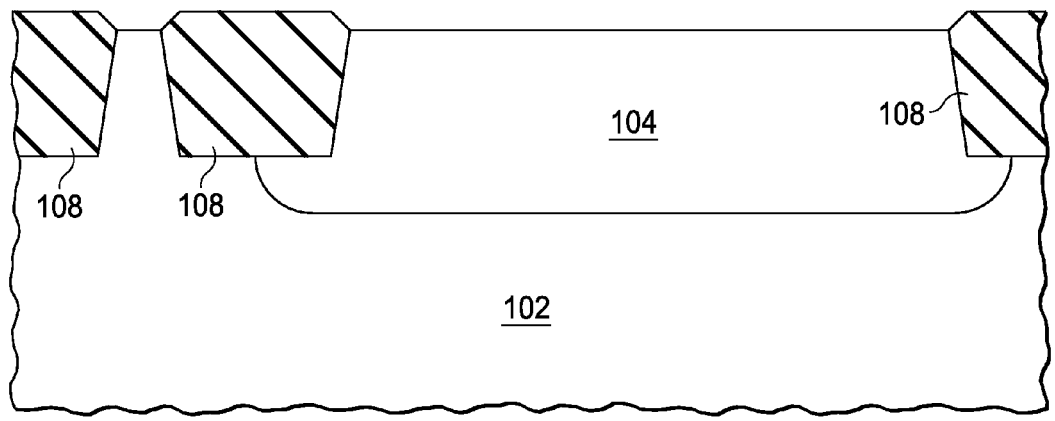
FIG. 3A through FIG. 3G are cross sections of the integrated circuit of FIG. 2 depicted in successive stages of fabrication.

FIG. 3A shows a partially processed integrated circuit in which an isolated well 104 is formed in a single crystal substrate 102 of opposite conductivity type. Shallow trench isolation (STI) geometries 108 prevent silicide from shorting the isolated well 104 to the substrate. For purposes of illustration an isolated n-type well 104 is formed in a p-type substrate 102. An isolated p-type well formed in an n-type substrate could also be used.

Figure 3B:
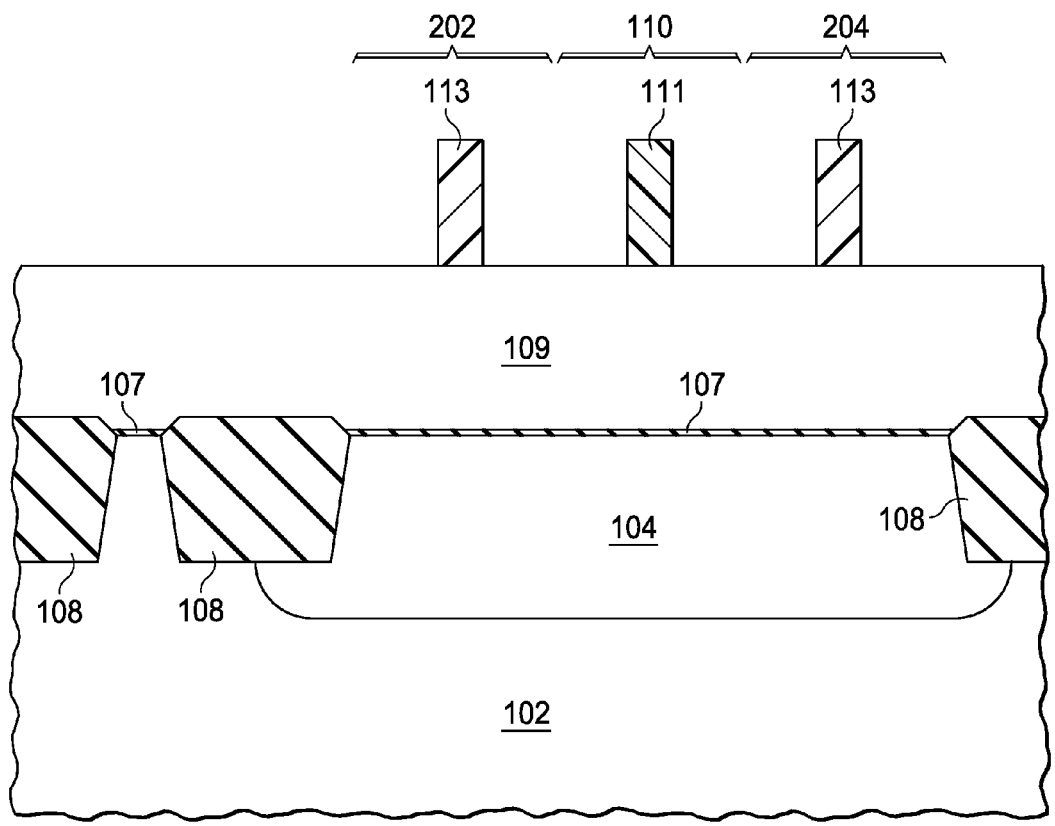

Referring now to FIG. 3B, a transistor gate dielectric 107 is formed on the n-type well 104 and the substrate 102 and gate material 109 such as polysilicon is deposited on the transistor gate dielectric 107. A transistor gate photoresist pattern with a transistor gate photo resist geometry 111 to form the gate of the transistor and with isolation transistor gate photo resist geometries 113 to form the isolation transistor gates 202 and 204 is formed on the gate material 109.

Figure 3C:
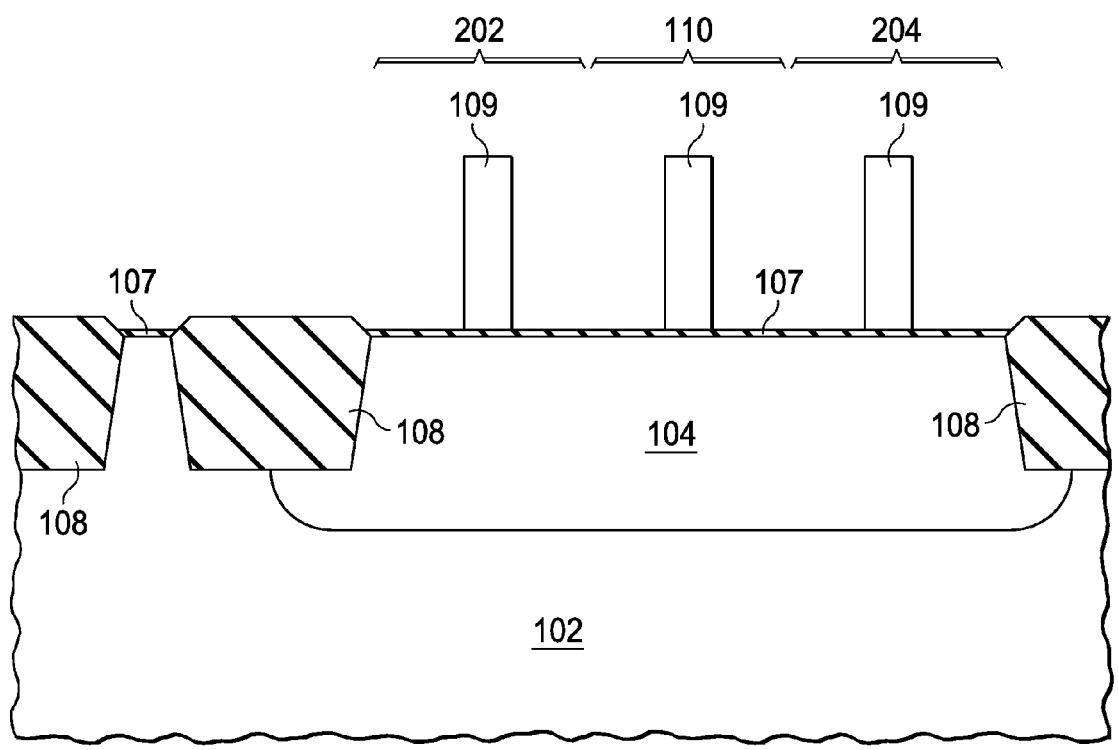

The gate material 109 is etched using resist geometries 111 and 113 to form the gate of the transistor 110 and to form the isolation transistor gates 202 and 204. The resist geometries 111 and 113 are then removed. The resulting gate of transistor 110 and isolation transistor gates 202 and 204 are shown in FIG. 3C.

Figure 3D:
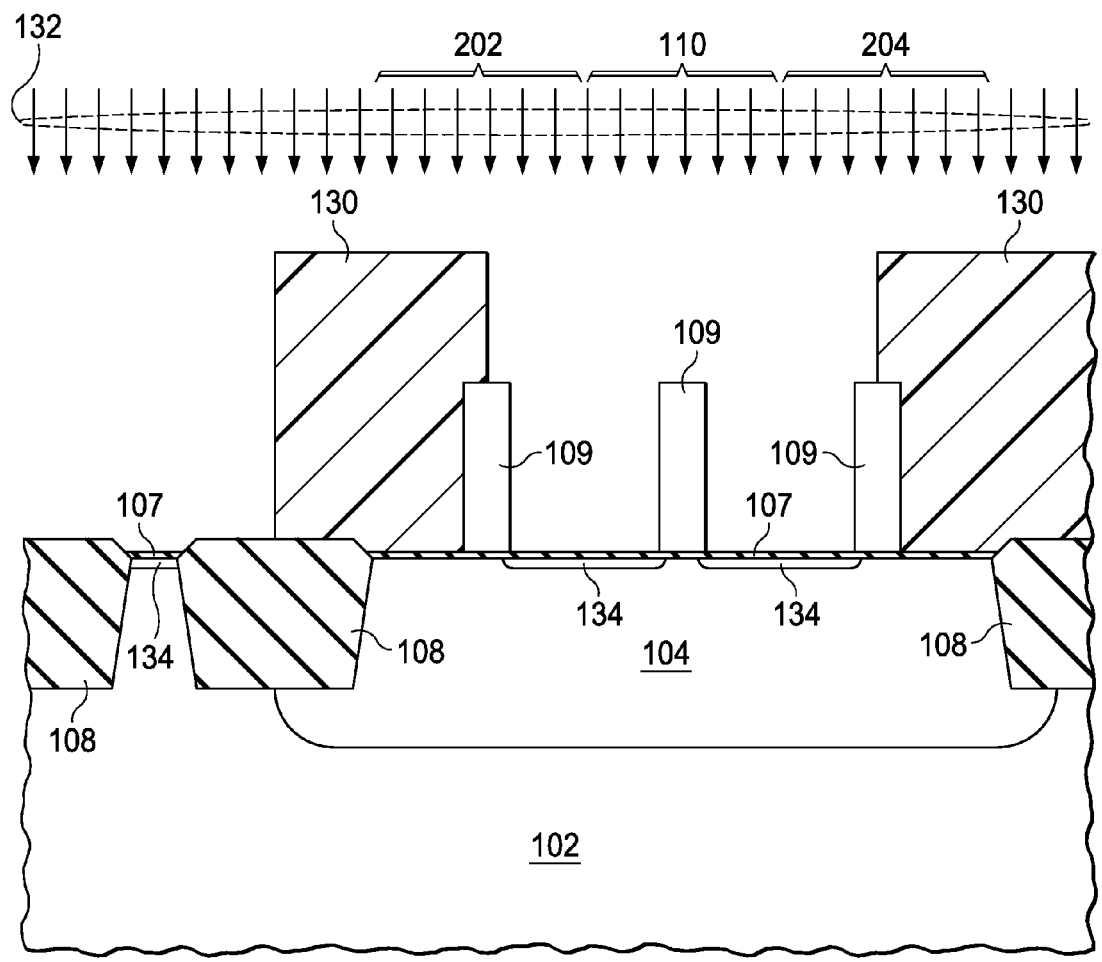

In FIG. 3D a PMOS extension photo resist pattern 130 is formed on the integrated circuit and p-type dopant 132 is implanted to form the source and drain extensions 134 self-aligned to the gate of the PMOS transistor 110.

Figure 3E:
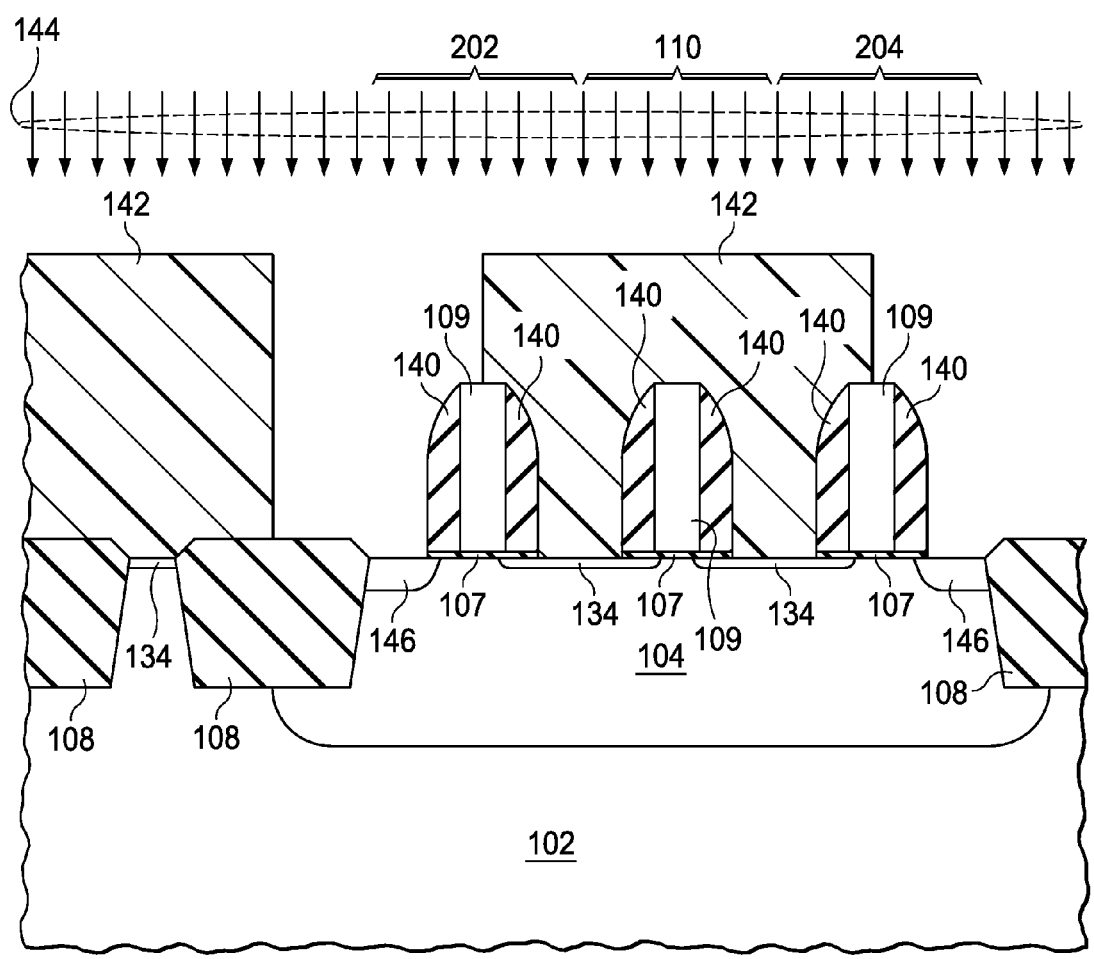

Sidewall spacers 140 are formed on the gate of the PMOS transistor 110 and on isolation transistor gates, 202 and 204, as shown in FIG. 3E. The sidewall spacers 140 may be formed of a dielectric material such as silicon dioxide and silicon nitride. A NMOS transistor source and drain (NSD) photo resist pattern 142 is formed on the integrated circuit and n-type dopant 144 is implanted to form the source and drains of NMOS transistors elsewhere in the circuit and to form contact diffusions 146 to the n-type well 104. The NSD pattern partially covers the isolation transistor gates 202 and 204 and covers the source and drain extensions 134 adjacent to the gate of the PMOS transistor 110. The NSD dopant is implanted to form well diffusions 146 self-aligned to the dielectric sidewall spacer 140 on the isolation transistor gates 202 and 204.

Figure 3F:
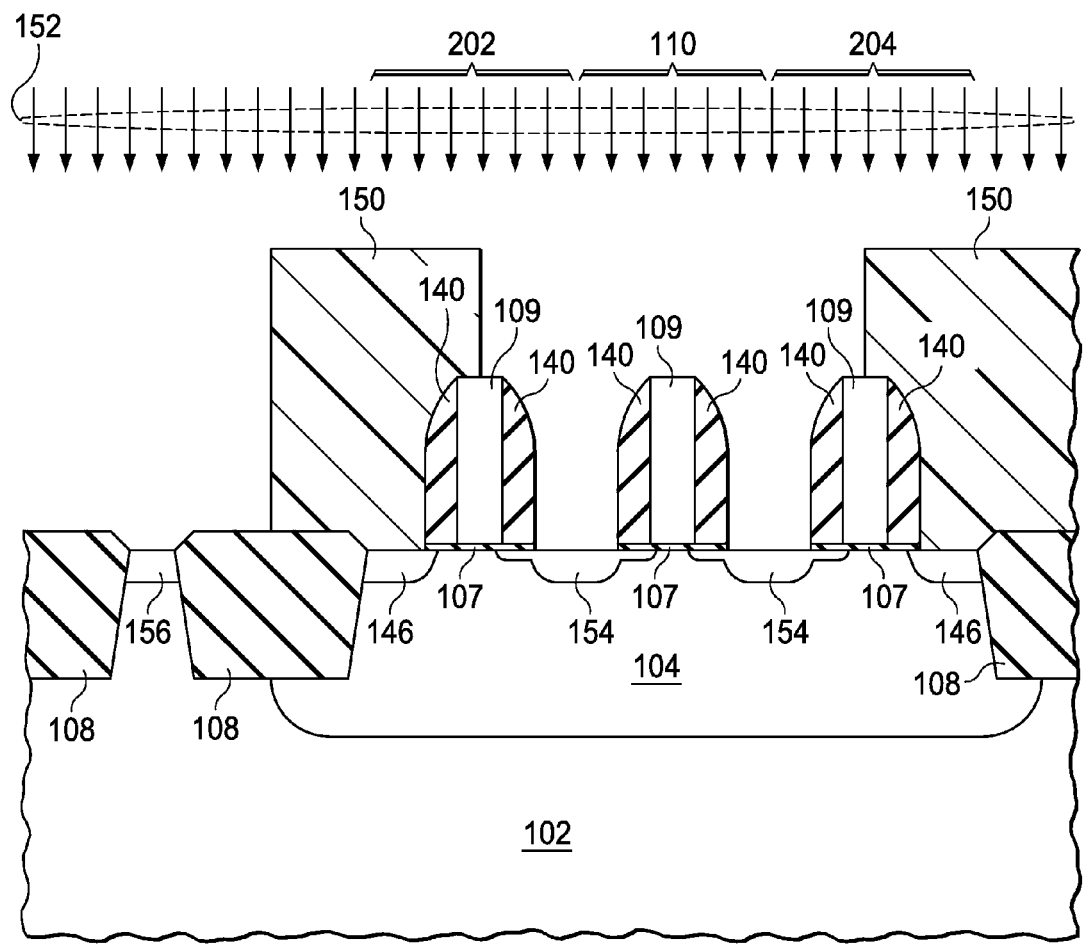

In FIG. 3F a PMOS source and drain (PSD) photo resist pattern 150 is formed on the integrated circuit and p-type dopant 152 is implanted self-aligned to the sidewall spacers 140 on the gate of the PMOS transistor 110 to form the PMOS transistor source and drain diffusions 154. The p-type dopant 152 is also implanted into the p-type substrate 102 to form the p-type substrate contact diffusion 156.

Figure 3G:
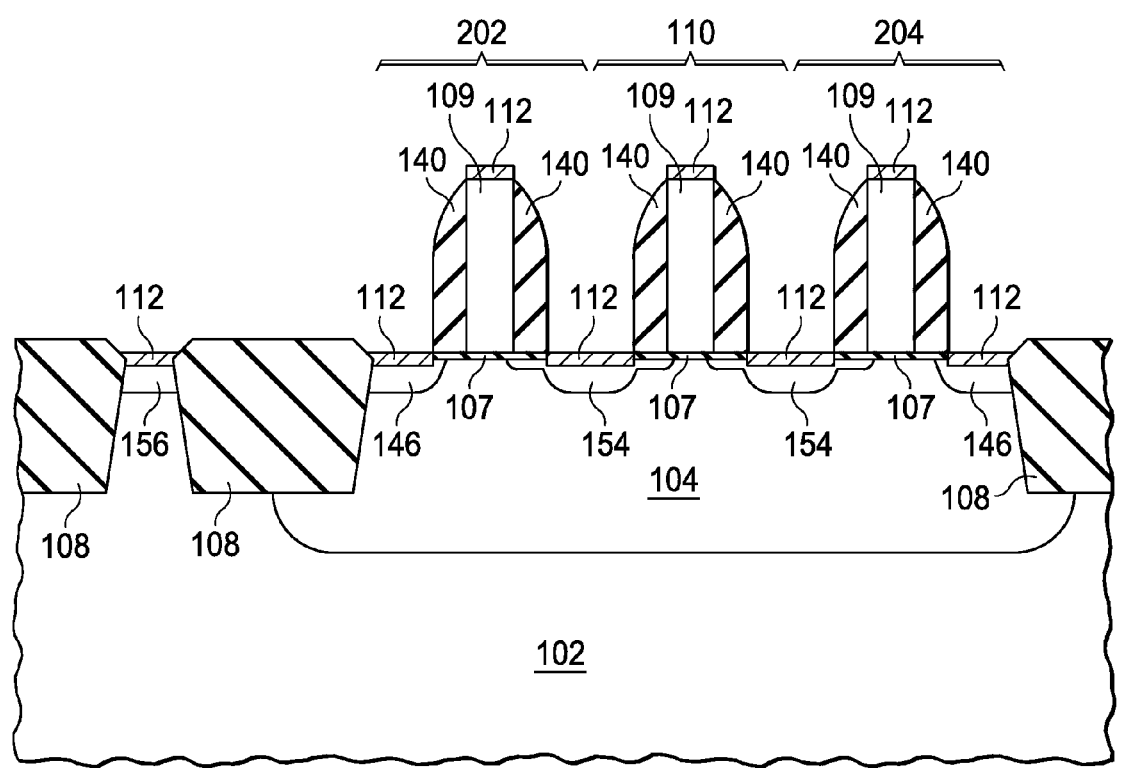

As illustrated in FIG. 3G, silicide 112 is formed in the usual manner on exposed silicon surfaces: on top of the gate of the PMOS transistor 110, on top of the isolation transistor gates 202 and 204, on top of the p-type substrate contact 156, on top of the nwell 104 contact 146, and on top of the PMOS transistor source and drain diffusions 154. The isolation transistor gates block silicide 112 from shorting the transistor source and drain diffusions 154 to the nwell contact diffusions 146.

Additional processing to form the premetal dielectric (PMD) 120 (FIG. 2), the contact plugs 116, and the first level of interconnect 126 may be performed on the integrated circuit in FIG. 3G to form the integrated circuit shown in FIG. 2. Additional processing may be performed on the integrated circuit in FIG. 2 to add additional levels of dielectric and interconnect to complete the integrated circuit.

The embodiment improved isolated well contact provides a lower resistance path between the well contact and devices in the well. The lower resistance path reduces the voltage drop between the isolated well contact and devices formed in the well thus avoiding degraded device performance.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising the steps:
   forming an isolated well with a second conductivity type in a substrate with a first conductivity type;
   forming a transistor gate dielectric on the isolated well and on the substrate;
   depositing transistor gate material on the transistor gate dielectric;
   forming a gate photo resist pattern on the transistor gate material with an isolation transistor gate photo resist geometry for forming an isolation transistor gate adjacent to a well contact region within the isolated well;
   etching the transistor gate material and to form the isolation transistor gate;
   forming dielectric sidewall spacers on the isolation transistor gate;
   forming a device diffusion photo resist pattern on the integrated circuit wherein photoresist covers a portion of the isolation transistor gate and covers the well contact region adjacent to a first side of the isolation transistor gate;
   implanting dopant of the first conductivity type to form a device diffusion adjacent to a second side of the isolation transistor gate;
   forming a well contact diffusion photo resist pattern on the integrated circuit wherein photoresist covers a portion of the isolation transistor gate and covers the device diffusion; and
   implanting dopant of the second conductivity type into the well contact region to form a well contact diffusion.

2. The integrated circuit of claim 1, wherein the first conductivity type is p-type and the second conductivity type is n-type.

3. The integrated circuit of claim 1, wherein the first conductivity type is n-type and the second conductivity type is p-type.

4. The integrated circuit of claim 1, wherein the device is a transistor device and wherein the process step of forming a transistor gate photo resist pattern further comprises forming a transistor device gate photo resist geometry.

5. The integrated circuit of claim 1, wherein the well contact diffusion implant is self-aligned to the dielectric sidewall spacer on a first side of an isolation transistor gate and wherein the device diffusion implant is self-aligned to the dielectric sidewall spacer on a second side of the isolation transistor gate.

6. A process of forming an integrated circuit, comprising the steps:
forming an isolated well with a second conductivity type in a substrate with a first conductivity type;
forming a transistor gate dielectric on the isolated well and on the substrate;
depositing transistor gate material on the transistor gate dielectric;
forming a gate photo resist pattern on the transistor gate material with an isolation transistor gate photo resist geometry for forming an isolation transistor gate adjacent to a well contact region within the isolated well and with a device transistor gate photo resist geometry for forming a device transistor gate;
etching the transistor gate material to form the isolation transistor gate and forming the gate of the device transistor;
forming dielectric sidewalls on the gate of the isolation transistor and on device transistor gate;
forming a first diffusion photoresist pattern on the integrated circuit wherein the first diffusion photoresist pattern covers a portion of the isolation transistor gate and covers the well contact region adjacent to a first side of the isolation transistor gate and has an opening over a source and drain region of the device transistor;
implanting dopant of the first conductivity type to form source and drain diffusions self-aligned to the dielectric sidewall spacers on the gate of the device transistor and self-aligned to the dielectric sidewall spacer on a second side of the isolation transistor gate;
forming a second diffusion photoresist pattern on the integrated circuit wherein the second diffusion photoresist pattern covers a portion of the isolation transistor gate and covers the device transistor gate and covers the transistor source and drain diffusions; and
implanting dopant of the second conductivity type into the well contact region to form a well contact diffusion.

7. The process of claim 6, wherein the first conductivity type is p-type and the second conductivity type is n-type.

8. The process of claim 6, wherein the first conductivity type is n-type and the second conductivity type is p-type.

9. The process of claim 6 further comprising the steps:
depositing a premetal dielectric over the integrated circuit;
forming a contact plug to the isolation transistor gate;
forming an interconnect geometry electrically connected to the contact plug;
coupling the interconnect geometry to a fixed voltage node.

10. The process of claim 9, wherein the isolated well is also coupled to the fixed voltage node.

11. The process of claim 9, wherein the fixed voltage node is a ground terminal.

12. A process of forming an integrated circuit, comprising the steps:
forming an isolated well of a second conductivity type in a substrate of a first conductivity type;
forming a transistor gate dielectric on the isolated well and on the substrate;
depositing transistor gate material on the transistor gate dielectric;
etching the transistor gate material to form an isolation structure over the isolated well and a gate of a transistor over the isolated well;
forming dielectric sidewalls on the isolation structure and on the gate of the transistor;
forming a first diffusion photoresist pattern on the substrate wherein the first diffusion photoresist pattern covers a portion of the isolation structure, covers a well contact region adjacent to a first side of the isolation structure, and has an opening over a source and drain region of the transistor;
implanting dopant of the first conductivity type to form source and drain diffusions in the isolated well self-aligned to the dielectric sidewall spacers on the gate of the transistor and self-aligned to the dielectric sidewall spacer on a second side of the isolation structure;
forming a second diffusion photoresist pattern on the integrated circuit wherein the second diffusion photoresist pattern covers a portion of the isolation structure, covers the gate of the transistor, covers the source and drain diffusions and exposes the well contact region; and
implanting dopant of the second conductivity type into the well contact region to form a well contact diffusion in the isolated well adjacent a first side of the isolation structure.

13. The process of claim 12, wherein the first conductivity type is p-type and the second conductivity type is n-type.

14. The process of claim 12, wherein the first conductivity type is n-type and the second conductivity type is p-type.

15. The process of claim 12, further comprising the steps:
depositing a premetal dielectric over the substrate;
forming a contact plug to the isolation structure;
forming an interconnect geometry electrically connected to the contact plug;
coupling the interconnect geometry to a fixed voltage node.

16. The process of claim 15, wherein the isolated well is also coupled to the fixed voltage node.

17. The process of claim 15, wherein the fixed voltage node is a ground terminal.

* * * * *